US010395736B2

(12) United States Patent
Tomita (10) Patent No.: US 10,395,736 B2
(45) Date of Patent: Aug. 27, 2019

(54) RESISTIVE RANDOM ACCESS MEMORY DEVICE

(71) Applicant: Winbond Electronics Corp., Taichung (TW)

(72) Inventor: Yasuhiro Tomita, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/953,829

(22) Filed: Apr. 16, 2018

(65) Prior Publication Data

US 2018/0308546 A1 Oct. 25, 2018

(30) Foreign Application Priority Data

Apr. 19, 2017 (JP) .................. 2017-082443

(51) Int. Cl.
*G11C 11/00* (2006.01)
*G11C 13/00* (2006.01)
*H01L 27/24* (2006.01)

(52) U.S. Cl.
CPC ........ *G11C 13/0069* (2013.01); *G11C 13/003* (2013.01); *G11C 13/0023* (2013.01);
(Continued)

(58) Field of Classification Search
CPC ............ G11C 13/0069; G11C 13/0023; G11C 13/0026; G11C 13/0028; G11C 13/003; G11C 13/0038; G11C 13/0097
See application file for complete search history.

(56) References Cited

U.S. PATENT DOCUMENTS 7,952,909 B2 * 5/2011 Inoue .................. G11C 13/0007
365/148
9,355,717 B1 * 5/2016 Nazarian ............ G11C 13/0002
(Continued)

FOREIGN PATENT DOCUMENTS

JP 2008041704 A 2/2008
JP 2012064286 A 3/2012
(Continued)

OTHER PUBLICATIONS

Lv et al., "Evolution of conductive filament and its impact on reliability issues in oxide-electrolyte based reistive random access memory," Scientific Reports, vol. 5, No. 7764, Jan. 14, 2015, pp. 1-6.

*Primary Examiner* — Pho M Luu
(74) *Attorney, Agent, or Firm* — Muncy, Geissler, Olds & Lowe, P.C.

(57) ABSTRACT

A resistive random access memory with superior area efficiency and higher reliability is provided. The resistive random access memory RRAM in the present invention includes a memory array, which includes a plurality of memory cells MC arranged in rows and columns. Each memory cell MC includes a variable resistive element and an access transistor. Gates of the access transistors in a column are connected to a word line WL. First electrodes of the variable resistive element in a row are connected to a bit line BL. Second electrodes of the variable resistive element in the row are connected to a source line SL. The source line SL includes a local source line 250, which extends in a direction that is orthogonal to the bit lines BL0/BL1/BL2/BL3 and is shared by the bit lines BL0/BL1/BL2/BL3.

10 Claims, 8 Drawing Sheets

(52) U.S. Cl.
CPC ...... *G11C 13/0026* (2013.01); *G11C 13/0028* (2013.01); *G11C 13/0038* (2013.01); *G11C 13/0097* (2013.01); *H01L 27/2436* (2013.01); *G11C 2013/0083* (2013.01); *G11C 2213/79* (2013.01); *G11C 2213/82* (2013.01)

(56) References Cited

U.S. PATENT DOCUMENTS

| | | | |
|---|---|---|---|
| 9,373,394 B2* | 6/2016 | Lee | G11C 13/004 |
| 9,923,028 B1* | 3/2018 | Hsu | H01L 23/528 |
| 2005/0153504 A1* | 7/2005 | Kawazoe | G11C 13/0007 |
| | | | 438/222 |
| 2012/0257437 A1 | 10/2012 | Seko | |
| 2014/0085964 A1 | 3/2014 | Nakano et al. | |
| 2015/0248931 A1 | 9/2015 | Nazarian | |
| 2016/0379710 A1 | 12/2016 | Sekar et al. | |

FOREIGN PATENT DOCUMENTS

| | | |
|---|---|---|
| JP | 2012221525 A | 11/2012 |
| JP | 20140063549 | 4/2014 |
| TW | 201351407 A | 12/2013 |
| TW | 201535365 A | 9/2015 |
| TW | 201612908 A | 4/2016 |

\* cited by examiner

FIG. 1A ( PRIOR ART )

| | $V_{BL}$ | $V_{SL}$ | $V_G$ |
|---|---|---|---|
| FORMING | + | GND | + |
| SET | + | GND | + |
| RESET | GND | + | ++ |

RESISTIVE RANDOM ACCESS MEMORY DEVICE

CROSS REFERENCE TO RELATED APPLICATIONS

This Application claims priority of Japan Patent Application No. 2017082443, filed on Apr. 19, 2017, the entirety of which is incorporated by reference herein.

BACKGROUND OF THE INVENTION

Field of the Invention

The invention relates to a resistive random access memory with variable resistive elements, and more particularly to a structure of a memory array.

Description of the Related Art

Resistive memory with variable resistive elements has become more important recently as it can be used as a non-volatile memory instead of a flash memory. Resistive memory is a memory that stores data by applying a pulse voltage to variable resistive elements to set each variable resistive element to a high resistance state or a low resistance state in a reversible and nonvolatile manner. There are some advantages to the resistive memory. One advantage is that power consumption is lower since a low voltage is applied to rewrite data. Another advantage is that, since it has a relatively simple structure—using a transistor plus a resistor for one cell, the area of the cell is smaller, about $6F^2$ (F indicates a wiring width of several tens of nanometers), thereby increasing the density. Another recent advance is that the read time is about 10 nanoseconds, which is as high as a DRAM (Patent Documents 1, 2, and the like).

Generally, in a resistive random access memory (RRAM: Registered Trademark), writing a low resistance state to a variable resistive element is referred to as a setting operation (SET), and writing a high resistance state to a variable resistive element is referred to as a resetting operation (RESET). There are a unipolar type and a bipolar type of resistive memory. In the unipolar type, the polarity of the write voltage applied to the variable resistive element for the setting operation is the same as that for the resetting operation, and the setting or resetting operation is performed by changing the magnitude of the write voltage. Moreover, since the memory array of the unipolar type can be made asymmetrical, it is easy to manufacture. On the other hand, in the bipolar type, the polarity of the write voltage applied to the variable resistive element for the setting operation is the inverse of that for the resetting operation. That is, the write voltage is applied to the variable resistive element from both directions, and thus the circuit is required to be symmetrical, meaning that fabrication of the memory array is more complicated than the unipolar type.

Figure 1A:
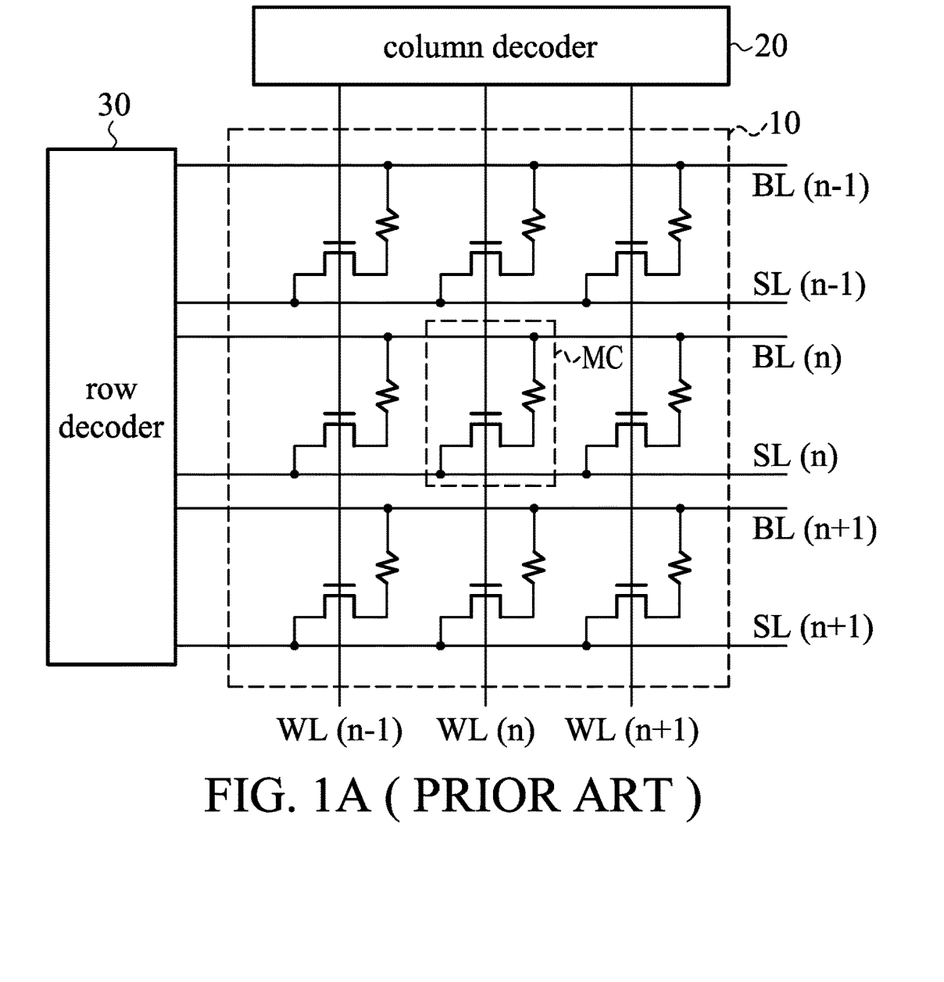
FIG. 1A is a circuit diagram showing a configuration of a memory array of a bipolar-type resistive memory disclosed in a prior art.

FIG. 1A is a circuit diagram showing the configuration of a memory array of a bipolar-type resistive memory disclosed in Non-Patent Document 1. In the memory array 10, a plurality of memory cells are formed in a two-dimensional array. However, FIG. 3 only shows a portion of the memory cells arranged in an array of 3 columns×3 rows. One memory cell MC is composed of one variable resistive element and one access transistor connected to the variable resistive element in series, and this configuration is called the 1T×1R configuration. The gate of the access transistor is connected to the word lines WL(n−1), WL(n), and WL(n+1), the drain thereof is connected to one electrode of the variable resistive element, and the source thereof is connected to the source lines SL(n−1), SL(n), and SL(n+1). The other electrode of the variable resistive element is connected to the bit lines BL(n−1), BL(n), and BL(n+1).

The variable resistive element is composed of a thin film oxide of a transition metal, such as hafnium oxide (HfOx), and is set or reset according to the polarity and magnitude of the write pulse voltage. The memory cells can be randomly accessed in the unit of one bit. For example, when the memory cell MC is accessed, the word line WL(n) is selected by the column decoder 20 to turn on the access transistor of the memory cell MC, and the bit decoder BL(n) and the source line SL(n) are selected by the row decoder 30. In the write operation, the write voltage corresponding to the setting or a resetting operation is applied to the selected bit line BL(n) and the selected source line SL(n). In the read operation, the setting or resetting voltage (or current) corresponding to the state of the variable resistive element appears on the selected bit line BL(n) and the selected source line SL(n) and can be detected by the sense circuit.

When a thin film of a metal oxide, such as hafnium oxide (HfOx), is used for the material of the variable resistive element, a forming operation must be performed on the metal oxide for an initial setting. Normally, in the forming operation, by applying a voltage Vf, which is higher than the voltage applied when the variable resistive element is written, to the thin film, the variable resistive element is brought into, for example, a low resistance state, which is the state that is closed to SET. A forming operation such as this is performed before the resistive memory is shipped.

Figure 1B:
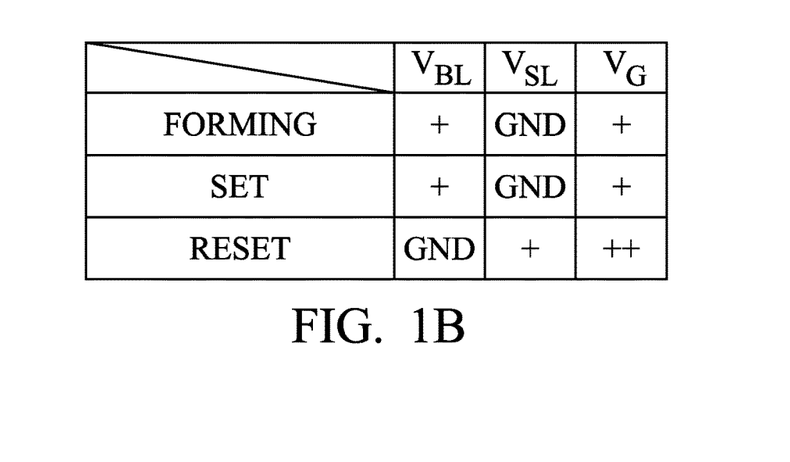
FIG. 1B is a schematic view showing bias voltages for the forming operation

FIG. 1B is a schematic view showing bias voltages for the forming operation. The voltage $V_{SL}$ of the source line SL is a ground voltage (GND), the voltage $V_{BL}$ of the bit line BL is a positive forming voltage, and the voltage $V_G$ of the word line WL is a positive voltage which is necessary for turning on the access transistor. Thus, a current flows through the variable resistive element from the bit line BL to the source line SL, and the variable resistive element is set to a low resistance state. Furthermore, when a resetting operation is performed on the variable resistive element, the voltage $V_{SL}$ of the source line SL is a positive voltage, the voltage $V_{BL}$ of the bit line BL is GND, and the voltage $V_G$ of the word line WL is a positive voltage. Thus, a current flows through the variable resistive element from the source line SL to the bit line BL, and the variable resistive element is set to a high resistance state.

PRIOR ART DOCUMENTS

Patent Document 1: Japanese Publication No. 2012-64286.
Patent Document 2: Japanese Publication No. 2008-41704.
Non-Patent Document 1: "Evolution of conductive filament and its impact on reliability issues in oxide-electrolyte based resistive random access memory" Hangbing Lv et. al., Scientific Reports 5, Article number: 7764 (2015).

BRIEF SUMMARY OF THE INVENTION

Problem to be Solved by the Invention

A bipolar-type resistive memory requires application of a bidirectional write voltage between a bit line and a source line. It is very important to provide uniform write voltages to all the memory cells for increasing the reliability of the memory. Therefore, for the bipolar type, a dedicated source line is configured in a one-to-one relationship with respect to the bit line and extends in the same direction as the bit line. There is symmetry between the bit line and the source line, in which the bit line and the source line can replace each other.

However, in such a memory array structure, since one dedicated source line is arranged for one bit line, the source line becomes an obstacle to reducing the width in the column direction of the memory array when a highly integrated memory is formed. Moreover, in cases where the bit line and the source line are formed on the same metal layer and arranged side by side along the same direction, the line width of the bit line/source line becomes smaller with miniaturization, and thus it becomes difficult to reduce the resistance of the source line. The resistance of the source line is an important factor in a reliable writing operation. In other words, a current flows through the source line during the write operation, and as the resistance of the source line increases, the voltage drop also increases and cannot be neglected. In order to obtain high reliability, it is desirable that a constant read voltage/write voltage is applied to each variable resistive element of the memory array. However, when the voltage drop of the source line increases, the voltage dispersion applied to the variable resistive elements becomes large. Therefore, it is desired to form a source line having a sufficient line width, but this will increase the area of the memory array.

An object of the present invention is to provide a resistive random access memory with better area efficiency without lowering reliability.

Means to Solve the Problem

An exemplary embodiment of a resistive memory for storing data by reversible and nonvolatile variable resistive elements is provided. The resistive memory comprises a memory array which comprises a plurality of memory cells arranged in columns and rows. Each memory cell comprises one variable resistive element and one access transistor connected to the variable resistive element. Gates of the access transistors in each column are connected to a word line. First electrodes of the variable resistive elements in each row are connected to a bit line, and second electrodes of the variable resistive elements in each row are connected to a source line. The source line comprises a first source line extending in a direction that is parallel to the bit line and a second source line derived from the first source line. The second source line extends in a direction that is orthogonal to the bit lines and is shared by several memory cells.

In a preferred embodiment, the first source is shared by 2m bit lines, and m is an integer that is greater than or equal to 1. In another preferred embodiment, the first source is shared by m bit lines arranged on the left side of the source line and m bit lines on the right side of the source line. In another preferred embodiment, the first source line is formed by the same first wiring layer as the first bit lines, and the second source line is formed by a second wiring layer which is under the first wiring layer. In a preferred embodiment, the resistive memory comprises a column selection device, a row selection device, and a voltage providing device. The column selection device selects the word lines in the columns of the memory array according to a column address. The row selection device selects the bit lines and the source lines in the rows of the memory array according to a row address. The voltage providing device provides voltages to the selected bit lines and the source lines which are selected by the row selection device in response to an operation mode. A write voltage is applied to the variable resistive elements from the selected bit lines and the selected source lines in two directions. In another preferred embodiment, the row selection device comprises a first switch circuit and a second switch circuit. The first switch circuit performs a selective connection between a global source line connected to the source line of the memory array and the 2m bit lines, and m is an integer that is greater than or equal to 1. The second switch circuit performs a selective connection between a global bit line and the 2m bit lines. In another preferred embodiment, when the write voltage is provided to the global source line, the unselected bit lines are precharged to the write voltage. In a preferred embodiment, the global bit line is coupled to a capacitor to compensate for difference of load capacitance between the global bit line and the source line. In another preferred embodiment, the voltage providing device comprises the capacitor.

Effect of the Invention

According to the embodiments, one source line comprises a first source line and a second source line derived from the first source line and the second source line are shared by several memory cells, so that one source line can be shared by several bit lines. Compared with the prior art in which the bit lines and the source lines are arranged in a one-to-one relationship, the area efficiency of the memory array can be improved, and the resistance of the source lines can be minimized. Thus, the uniformity of the voltages applied to memory cells can be maintained, and the reliability of the resistive memory is improved.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Next, embodiments of the present invention will be described in detail with reference to the drawings. It should be noted, however, that the drawings emphasize each part in order to facilitate the understanding of the invention, and the dimensions and the relative dimensions do not correspond to actual dimensions in the practice of the invention.

Figure 2:
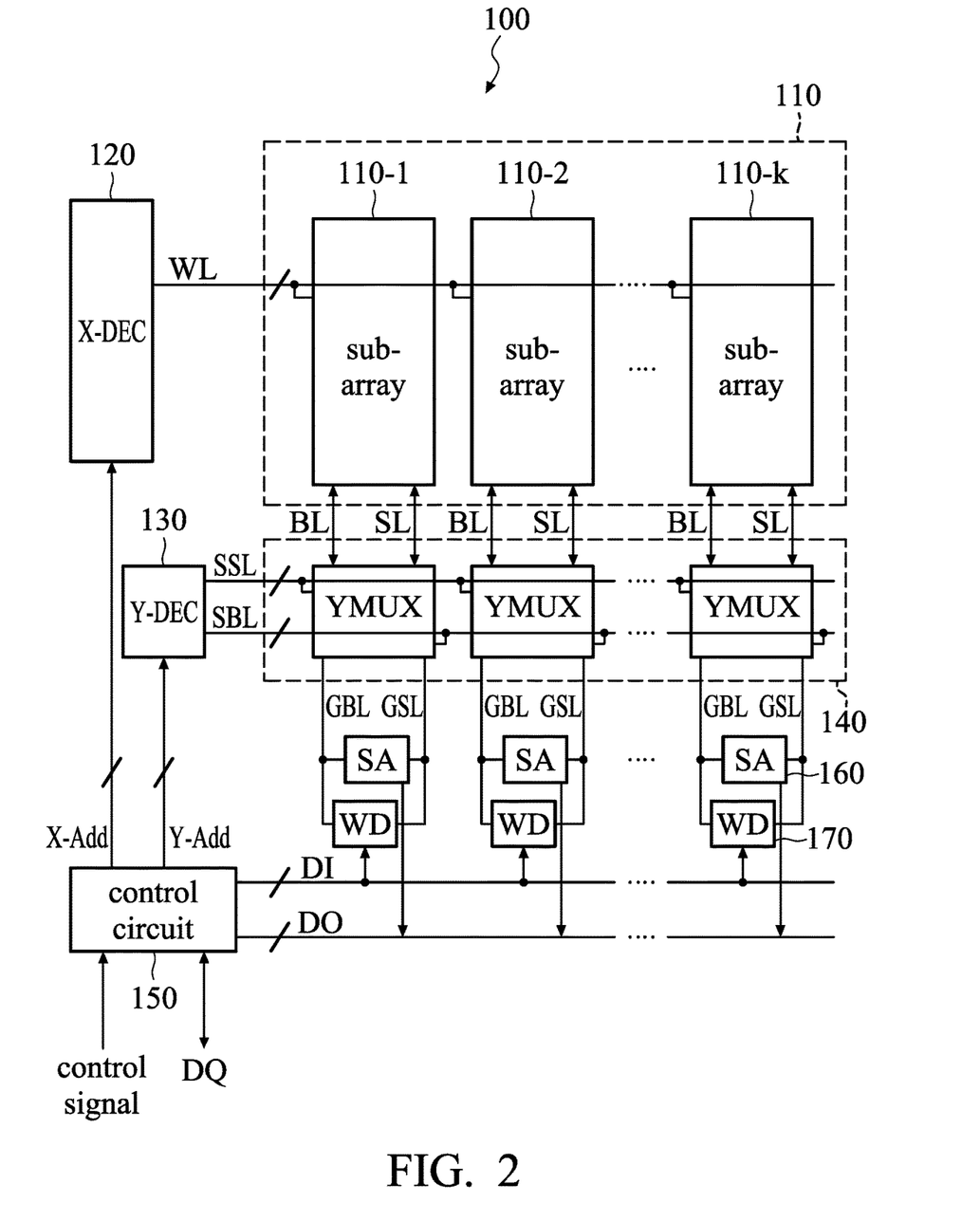
FIG. 2 is a block diagram showing a schematic structure of a resistive random access memory according to an exemplary embodiment.

FIG. 2 is a block diagram showing a schematic structure of a resistive random access memory according to an embodiment of the present invention. The resistive memory 100 of the embodiment comprises a memory array 110, a decoder and driving circuit (X-DEC) 120, a row decoder and driving circuit (Y-DEC) 130, row selection circuits (YMUX) 140, a controller circuit 150, sense amplifiers (SA) 160, and write driver and read bias circuits (WD) 170. The memory array 110 comprises a plurality of memory cells which are arranged in columns and rows, each memory cell comprises a variable resistive element and an access transistor. The column decoder and driving circuit (X-DEC) 120 performs a selection and driving operation for the word lines WL according to a column address X-Add. The row decoder and driving circuit (Y-DEC) 130 generates selection signals SSL/SBL which are provided to select global bit lines GBL and global source lines GSL according to a row address Y-Add. The row selection circuits 140 select the connection between the global bit lines GBL and the bit lines BL and the connection between the global source lines GSL and the bit lines BL according to the selection signals SSL/SBL. Based on commands, addresses, data received from the outside, the control circuit 150 controls each portion in the resistive memory 100. The sense amplifiers 160 sense the data read out from the memory cells through the lines GBL/GSL. The write driver and read bias circuits 170 apply bias voltages for a read operation and voltages corresponding to the setting and resetting operations for the write operation through the lines GBL/GSL.

The memory array 110 comprises k sub-arrays 110-1, 110-2, . . . , 110-k. K row selection circuits (YMUX) are connected to the k corresponding sub-arrays 110-1, 110-2, . . . , 110-k. The row selection circuits (YMUX) are connected to the sense amplifiers 160 and the write driver/read bias circuits 170, respectively. Each sense amplifier 160 is connected to the control circuit 150 through the internal data bus DO, and the results sensed by the sense amplifiers 160 are output to the control circuit 150 through the internal data bus DO. In addition, each write driver/read bias circuit 170 is connected to the control circuit 150 through the internal data bus DI, and each write driver/read bias circuit 170 receives write data through the internal data bus DI.

Figure 3:
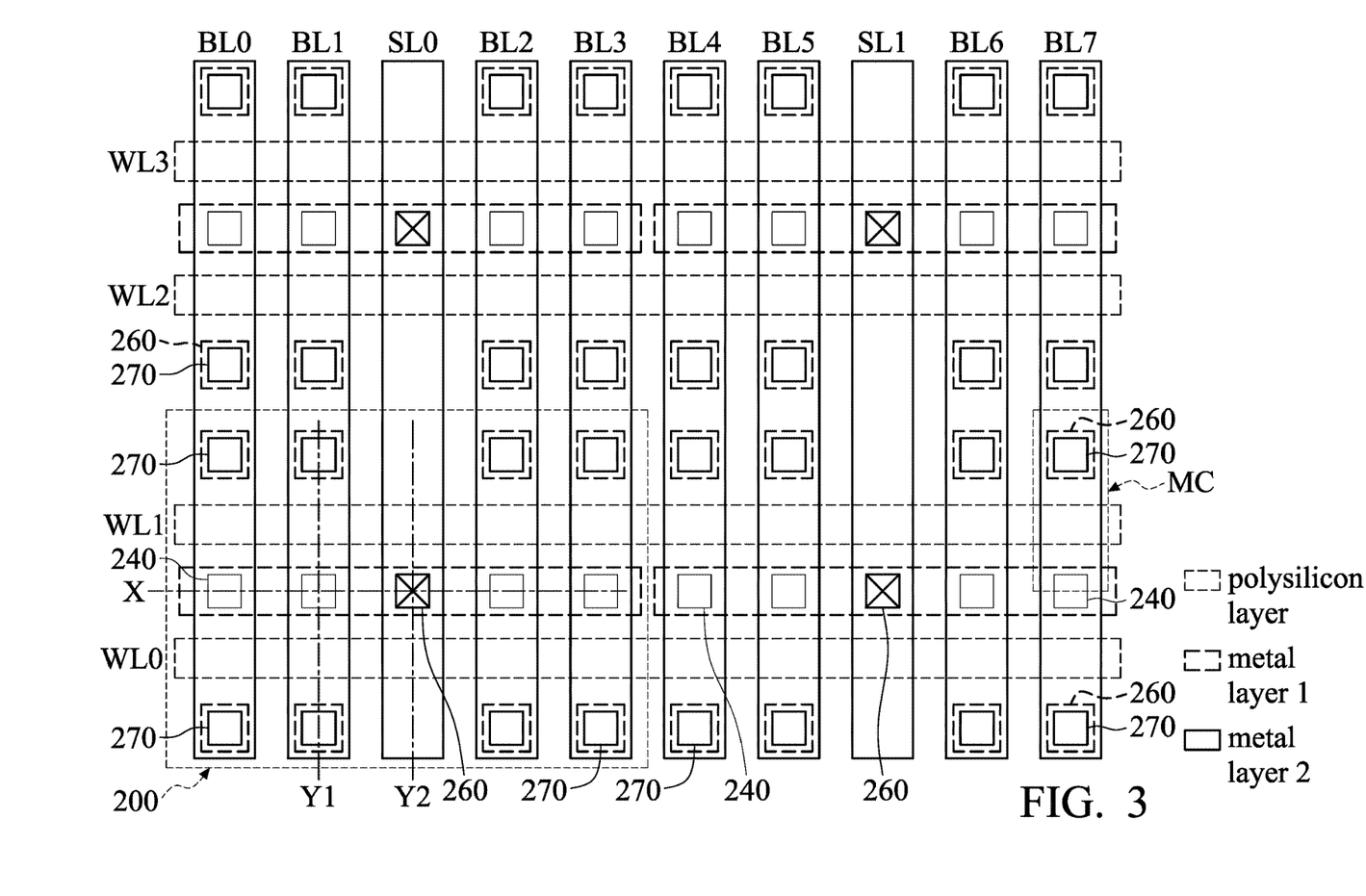
FIG. 3 is a schematic plan view of a partial structure of the memory array according to an exemplary embodiment.

Details of the memory array 110 of this embodiment are described below. FIG. 3 is a schematic plan view of a plurality of memory cells included in one sub-array of the memory array 110. The memory array comprises a multi-layer wiring structure on a silicon substrate. In the embodiment, there are two metal layers (the metal layer 1 and the metal layer 2 from the side of the silicon substrate) and one conductive polysilicon layer on the silicon substrate. The word lines WL0/WL1/WL2/WL4 (all the word lines are collectively referred to as "word lines WL") are constituted by the polysilicon layer extending in the horizontal direction on the silicon substrate. The polysilicon layer is used as the gates of the respective access transistors in the memory cells. The bit lines BL0/BL1/BL2/BL3/BL4/BL5/BL6/BL7 are formed in a direction that is orthogonal to the word line WL (all the bit lines are collectively referred to as "bit lines BL"). The bit lines BL are wired by the metal layer 2 above the polysilicon layer and is made of a metal, such as Al or Cu.

The source lines SL0/SL1 (all the source lines are collectively referred to as "source lines SL") are formed to be in parallel with the bit lines BL. Like the bit lines BL, the source line SL is wired by the metal layer 2 (or on the metal layer 1). In the embodiment, the source line SL0 is shared by the four bit lines BL0/BL1/BL2/BL3, and the source line SL1 is shared by the four bit lines BL4/BL5/BL6/BL7. That is, two bit lines are disposed symmetrically on each of the left and right sides of the source lines SL0 and SL1.

Figure 4A:
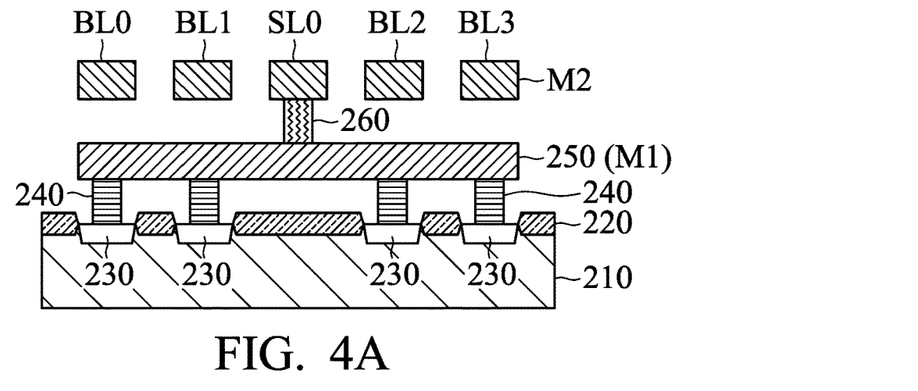
FIG. 4A shows an X-line cross section of an area 200 shown in FIG. 3.
Figure 4B:
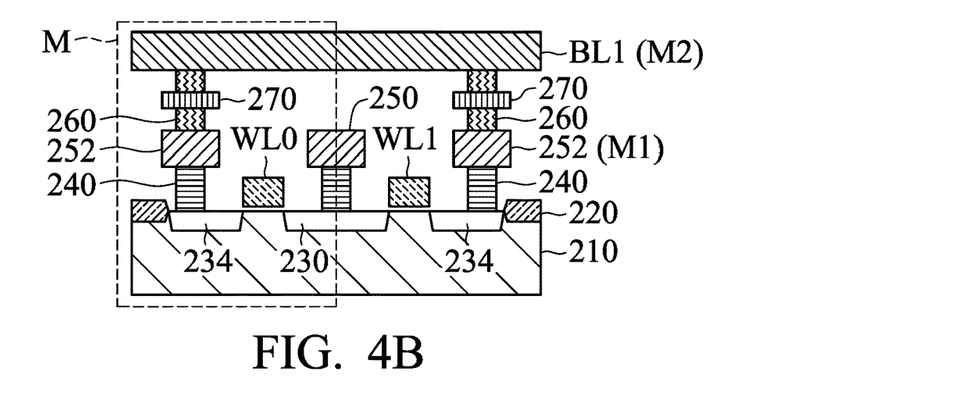
FIG. 4B shows a Y1-line cross section of the area 200 shown in FIG. 3.
Figure 4C:
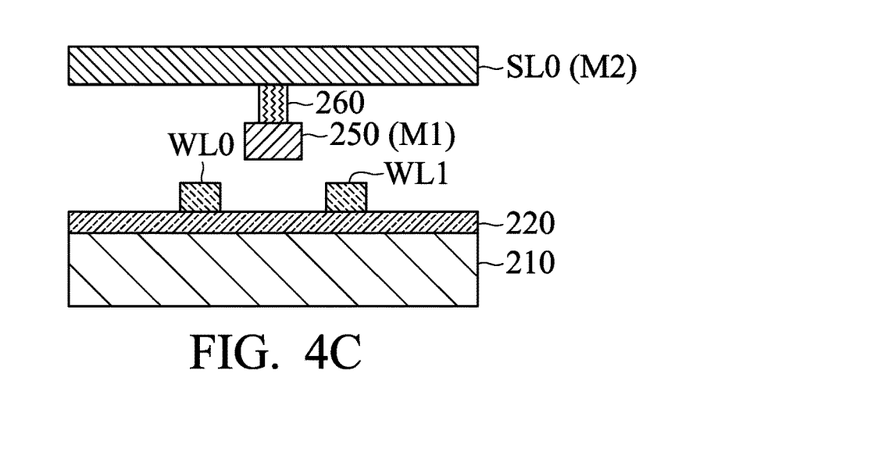
FIG. 4C shows a Y2-line cross section of the area 200 shown in FIG. 3.

FIGS. 4A, 4B, and 4C show an X-line cross section, a Y1-line cross section, and a Y2-line cross section of an area 200 of the sub-array region shown in FIG. 3. In FIG. 4A, for example, an insulation region 220 is formed on the surface of a P-type silicon substrate 210 for defining an active region of the access transistors. The insulation region 220 cam be formed by, for example, shallow trench isolation (STI). On a silicon substrate 210, the local source line 250 is wired on the metal layer 1. The metal layer 1 is a layer between the polysilicon layer and the metal layer 2. The metal 1 is made of a metal, such as Al or Cu. The local source line 250 is parallel to the word lines and extends in a direction which is interlaced with the four bit lines BL0/BL1/BL2/BL3. The local source line 250 is electrically connected to four source regions 230 formed on the surface of the silicon substrate 210 via contact plugs 240 in contact holes formed in an interlayer insulation film, such as a silicon oxide film, respectively. As shown in FIG. 4B, one source region 230 is shared by two access transistors on the word lines WL0 and the word line WL1, so that one local source line 250 can be connected to the source regions 230 of the access transistors in eight memory cells.

As shown in FIG. 1, one electrode of the variable resistance element is electrically connected to one bit line, and the other electrode is electrically connected to the drain of the access transistor. As shown in FIG. 4B, the bit line BL1 wired by the metal layer 2 is connected to a relay contact layer 252 wired by the metal layer 1 via the contact plugs 260. The relay contact layer 252 is patterned at the same time as the local source line 250. During the manufacturing process of the contact plugs 260, an oxide thin film of a transition metal, such as hafnium, is formed, and then variable resistive elements 270 sandwiched by the contact plugs 260 are formed. The relay contact layer 252 is electrically connected to drain regions 234 formed on the surface of the substrate via contact plugs 240 connected between the metal layer 1 and the silicon substrate 210. The broken line M in FIG. 4B represents one memory cell composed of one variable resistive element 270 and one access transistor, and the region 200 comprises eight memory cells.

Figure 5:
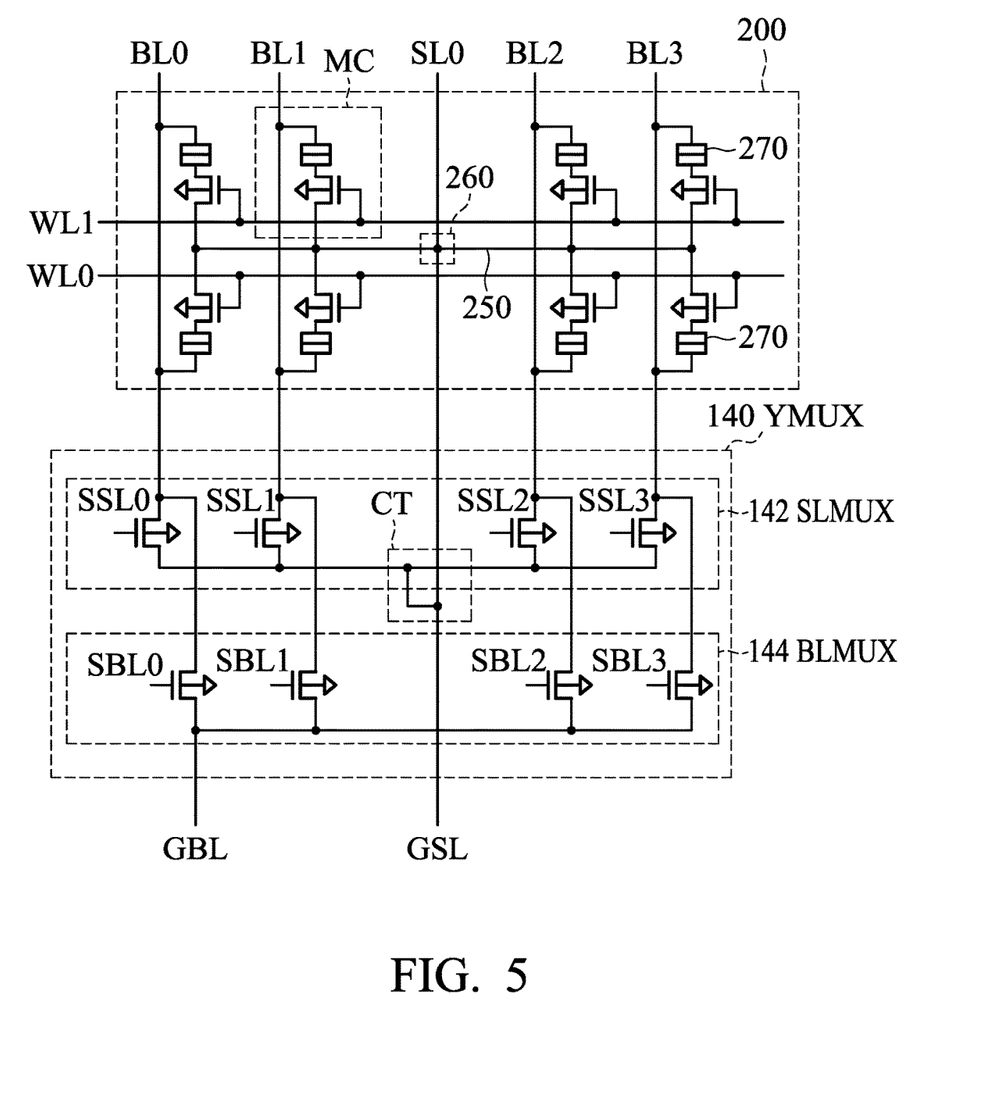
FIG. 5 shows a schematic diagram showing structures of the memory array and a row selection circuit according to one exemplary embodiment.

FIG. 5 shows a schematic diagram showing structures of the memory array of the area 200 and one row selection circuit (YMUX) 140. When the memory array 110 is composed of k sub-arrays 110-1~110-k, k row selection circuits 140 are connected to the k sub-arrays 110-1~110-k, respectively. In addition, the row selection circuit 140 are connected to k write driver/read bias circuits 170 through the global source lines GSL and the global bit line GBL. If one sub-array is composed of p bit lines and one source line is shared by q bit lines, each write driver/read bias circuit 170 selectively drives p/q global bit lines GBL and p/q global source lines GSL.

FIG. 5 shows an example in which one global source line GSL is connected to one source line SL0. As shown in the figure, the global source line GSL and the source line SL0 are electrically connected to four source regions 230 via the contact plug 260 and the local source line 250. The global source line GSL is further electrically connected to the SLMUX 142 of the row selection circuit 140 via the contact window CT. When the global source line GSL is wired by the metal layer 2, the global source line GSL and the source line SL 0 are patterned by lithography simultaneously.

The YMUX 140 comprises two analog multiplexers SLMUX 142 and BLMUX 144. The SLMUX 142 is a selection circuit for the global source line for connecting the global source line GSL to one of the bit lines BL0/BL1/BL2/BL3. The SLMUX 142 comprises four n-channel selection transistors respectively connected to the bit lines BL0/BL1/BL2/BL3 in series, and the selection signals SSL0/SSL1/SSL2/SSL3 output from the row decoder 130 are provided to the respective gates of the selection transistors. Furthermore, the input terminal of the SLMUX 142 is connected to the global source line GSL via the contact window CT, so that the drain regions of the four selection transistors are electrically connected to the global source line GSL. The row decoder and driving circuit 130 drives the selection signals SSL0~SSL3 to an H level or an L level according to the row address. The SLMUX 142 turns on one of the selection transistors according to the selection signals SSL0~SSL3, so that the global source line GSL is connected to one of the bit lines BL0/BL1/BL2/BL3.

The BLMUX 144 is a selection circuit for the global source line for connecting the global bit line GBL to one of the bit lines BL0/BL1/BL2/BL3. The BLMUX 144 comprises four n-channel selection transistors respectively connected to the bit lines BL0/BL1/BL2/BL3 in series, and the selection signals SSL0/SSL1/SSL2/SSL3 output from the row decoder 130 are provided to the respective gates of the selection transistors. The four selection transistors of the BLMUX are connected to the four selection transistors of the SLMUX 142 corresponding to the same bit line in parallel. Furthermore, the input terminal of the BLMUX 144 is connected to the global bit line GBL via the contact window CT, that is, the drain regions of the four selection transistors are electrically connected to the global bit line GBL. The row decoder and driving circuit 130 drives the selection signals SSL0~SSL3 to an H level or an L level according to the row address. The BLMUX 144 turns on one of the selection transistors according to the selection signals SSL0~SSL3, so that the global bit line GBL is connected to one of the bit lines BL0/BL1/BL2/BL3.

Figure 6:
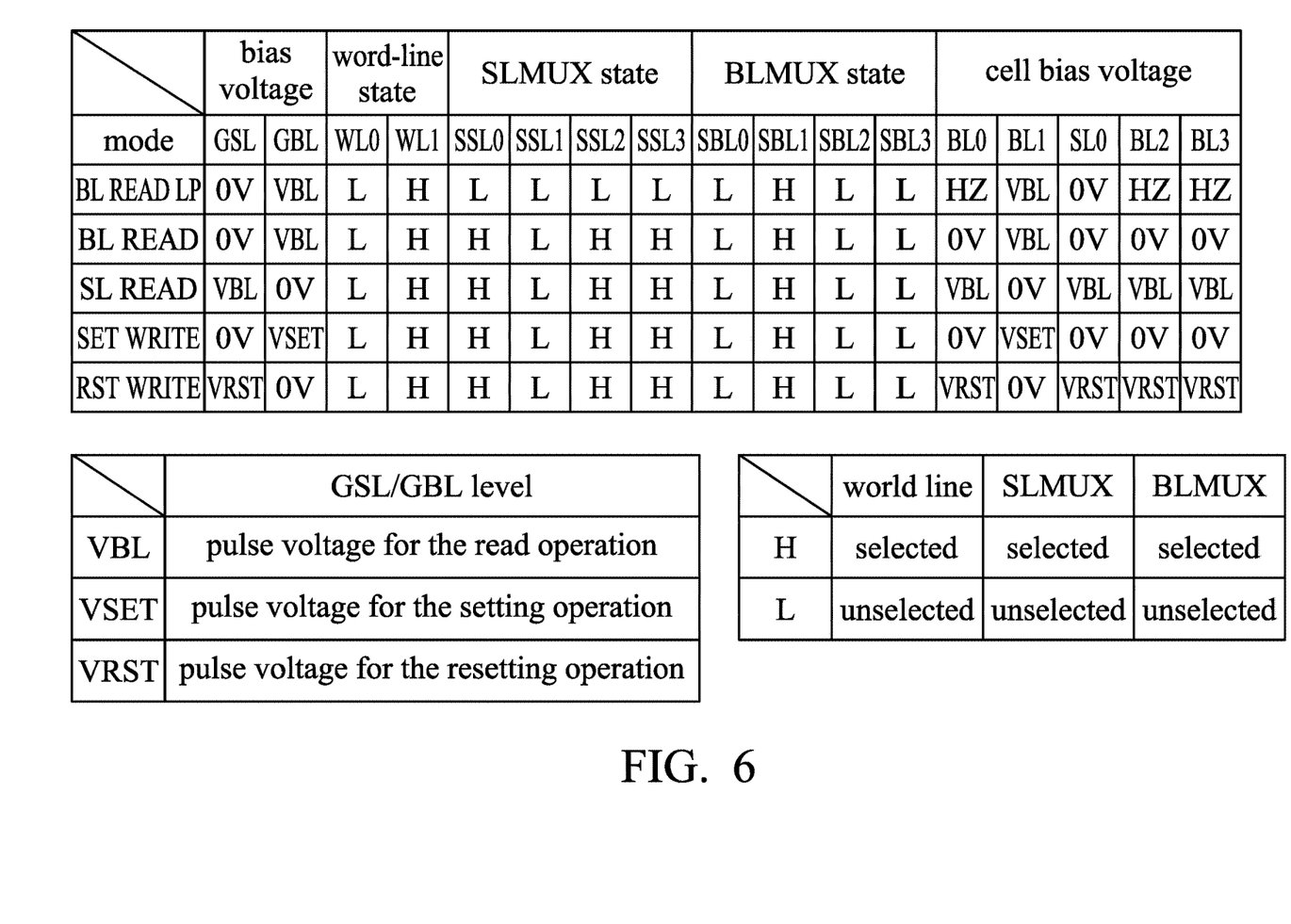
FIG. 6 is a table showing biases of respective portions of the resistive memory and the process steps of the row selection circuit when the resistive memory operates according to the exemplary embodiment.

Next, the operation of the resistive memory of the embodiment will be described. Here, it is assumed that the memory cell MC shown in FIG. 5 is selected, the driving conditions and the like of each portion at that time are shown in the table of FIG. 6.

Regarding the operation mode, the bit line-read-low-power mode (represented by BL READ LP in FIG. 6) and the bit-line read mode (represented by SL READ in FIG. 6) are related to the read mode for the bit-line side. First, the bit line-read-low-power mode will be described. In this case, the write driver and read bias circuits 170 biases the read voltage VBL to the corresponding global bit line GBL and biases 0 V or a voltage close to the ground to the corresponding global source line GSL.

All of the selection signals SSL0~SSL3 are set to the L level by the row decoder and driving circuit 130, and all of the four selection transistors of the SLMUX 142 are not switched and keep turned off. Since the selection transistors of the SLMUX 142 are turned off, the global source line GSL is disconnected from the bit lines BL0/BL1/BL2/BL3. The global source line GSL provides 0 V or GND to the source regions 230 of the access transistors through the source line SL0 and the local source line 250.

The selection signal SBL1 of the BLMUX 144 is driven to the H level, and the corresponding selection transistor is turned on, so that the global bit line GBL is connected to the selected bit line BL1. The other selection signals SBL0, SBL2, and SBL3 are driven to the L level, and the corresponding selection transistors are turned off, so that the unselected bit lines BL0, BL2, and BL3 are in a high impedance (HZ) floating state. As a result, the selected bit line BL 1 is biased to VBL, and the source line SL0 is biased to 0 V.

Next, by the column decoder and driving circuit 120, the selected word line WL1=is driven to the H level, and the unselected word line WL0 is driven to the L level. As a result, the access transistor of the memory cell MC is turned on. If the variable resistive element 270 is in the low resistance state (SET), a large current flows from the global bit line GBL to the global source line GSL; if the variable resistive element 270 is in the high resistance state (RESET), a very small current or no current flows from the global bit line GBL to the global source line GSL. The corresponding sense amplifier 160 senses the voltage or current of the global bit line GBL and outputs data "0" and "1" corresponding to the sense result by the DQ terminal as the read data.

In the bit line-read-low-power mode (BL READ LP), since the selection transistors of the SLMUX 142 are not driven, the power consumption of the SLMUX 142 can be reduced to zero. In addition, since the adjacent unselected bit line BL0 is in a floating state, the coupling capacitance between the bit lines BL0 and BL1 is reduced, which reduces power consumption.

The difference between the bit-line read mode (BL READ) and the bit line-read-low-power mode (BL READ LP) is the operation of the SLMUX 142. The row decoder and driving circuit 130 drives the selection signals SSL0, SSL2, and SSL3 to the H level and drives the selection signal SSL1 to the L level. Thus, by switching the selection transistors in the SLMUX 142 driven by the selection signals SSL0, SSL2, and SSL3 to the turned-on state, the unselected bit lines BL0, BL2, and BL3 are connected to the global source line GSL. Since the voltage of the unselected bit line is fixed to 0 V or a voltage close to the ground, the read interference which is induced by the capacitive coupling between the selected bit lines and the unselected bit line can be suppressed.

The source-line read mode (SL READ) is related to the read mode for the source-line side. In this operation mode, the write driver and read bias circuit 170 biases the read voltage VBL to the corresponding global source line GSL and biases 0V or a voltage close to the ground to the corresponding global bit line GBL. The operations of the SLMUX 142 and the BLMUX 144 are the same as those in the bit-line read mode (BL READ), but the direction of the current applied to the selected memory cell MC is inverse. The bit-line read mode (BL READ) and the source-line read mode (SL READ) is preferably selected according to the interference characteristic.

The set-write mode (SET WRITE) is an operation mode in which a low resistance state is written into the variable resistive element. In the set-write mode (SET WRITE), the write driver and read bias circuit 170 applies a write pulse with an amplitude VSET to the global bit line GBL between the global bit line GBL and the global source line GSL. The row decoder and driving circuit 130 drives the selection signal SBL1 to the H level and drives the selection signals SBL0, SBL2, and SBL3 to the L level, so that the global bit line GBL is connected to the selected bit line BL1, and the unselected bit lines BL0, BL2, and BL3 are disconnected from global bit line GBL. In addition, the row decoder and driving circuit 130 drives the selection signals SSL0, SSL2, and SSL3 to the H level and drives the selection signal SSL1 to the L level, so that the unselected bit lines BL0, BL2, and BL3 are connected to the global source line GSL through the selection transistors of the SLMUX 142, and the selected bit line BL1 is are set to 0 V or a voltage close to the ground.

Then, the word line WL1 selected by the column decoder and driving circuit 120 is driven to the H level, and the write pulse with the amplitude VSET is applied to the variable resistive element 270 of the selected memory cell MC, so that the variable resistive element 270 has a high resistance state. By turning off the select transistors of the BLMUX 144, the write pulse from the global bit line GBL cannot be applied to the unselected bit lines.

The reset-write mode (RST WRITE) is an operation mode in which a high resistance state is written in a variable resistive element. In the set-write mode (RST WRITE), the write driver/read bias circuit 170 applies a pulse with an amplitude VRST to the global source line GSL between the global bit line GBL and the global source line GSL. That is, compared with the operation of the set-write mode, the polarity of the written voltage is reversed. The SLMUX 142 and BLMUX 144 perform the same selection operations as the set-write mode.

The BLMUX 144 connects the selected bit line BL1 to the global bit line GBL, so that the voltage of the selected bit line BL1 is 0V or a voltage close to GND, the unselected bit lines BL0, BL2, and BL3 are disconnected from the global bit line GBL. On the other hand, the SLMUX 142 disconnects the selected bit line BL1 from the global source line GSL and connects the unselected bit lines BL0, BL2, and BL3 to the global source line GSL.

Then, the word line WL1 selected by the column decoder and driving circuit 120 is driven to the H level, and the write pulse with the amplitude VRST is applied to the variable resistive element 270 of the selected memory cell MC, so that the variable resistance element 270 is reset to the low resistance state. At this time, since the selection transistors driven by the selection signals SSL0, SSL2, and SSL3 of the SLMUX 142 are turned on, the unselected bit lines BL0, BL2, and BL3 are pre-charged by the reset voltage VRST of the global source line GSL. By applying the same voltage as the source line to the unselected bit lines, there is no potential difference therebetween, and thus and write interference on the unselected memory cells can be suppressed.

Figure 7A:
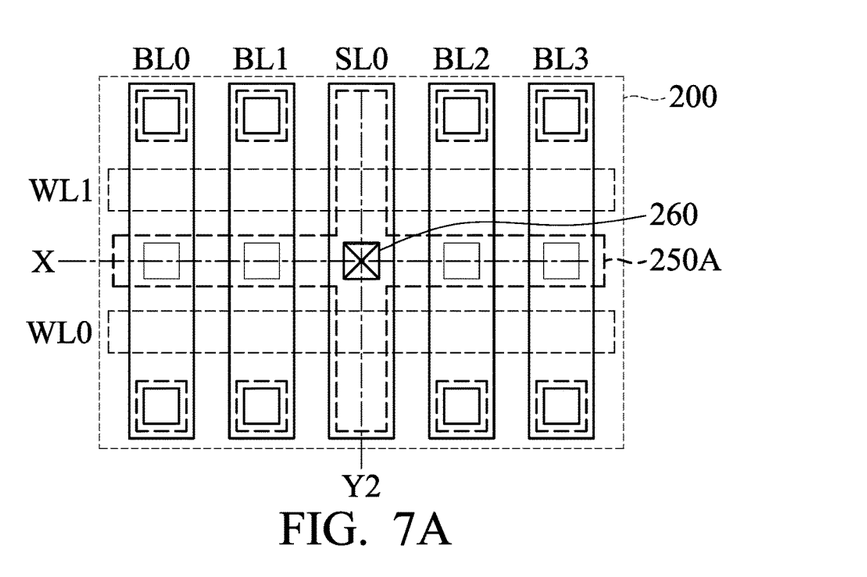
FIG. 7A is a schematic plan view of a structure of the memory array according to another exemplary embodiment.
Figure 7B:
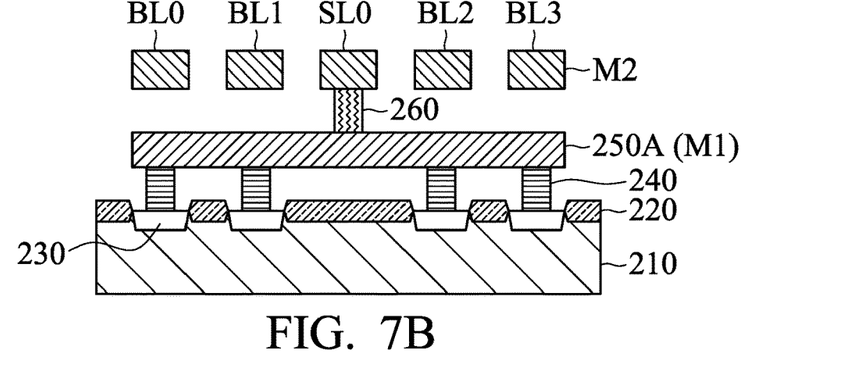
FIG. 7B shows an X-line cross section of FIG. 7A.
Figure 7C:
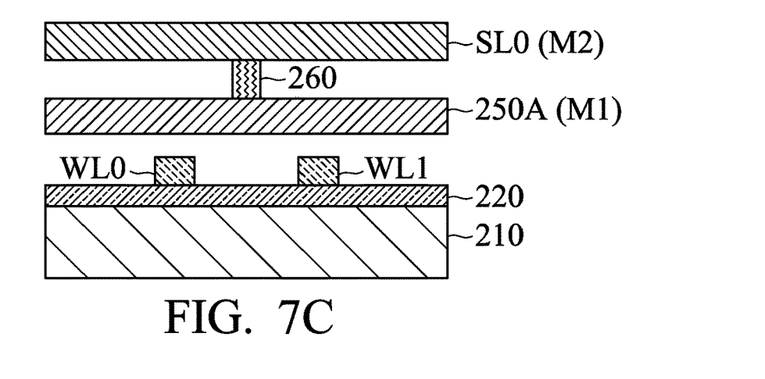
FIG. 7C shows a Y2-line cross section of FIG. 7A.

Another exemplary embodiment of the local source line is described below. FIG. 7A is a schematic plan view of the area 200 of the memory array shown in FIG. 3. The local source line 250A wired by the metal layer 1 comprises a horizontal portion and a vertical portion, wherein the horizontal portion is parallel to the word lines and extends from the bit line BL0 to the bit line BL3, and the vertical portion extends from the contact plug 260 portion of the horizontal portion in the direction of the bit lines. Since the source line SL0 of the metal layer 2 is wired by a constant pitch between the source line SL0 and each of the adjacent bit lines BL1 and BL2, the line width of the source line SL0 is also limited to being equal to the line width of the bit lines. However, the source line is formed by a two-layer structure, and thus the flexibility of the layout of the source line can be increased. In other words, since there are no adjacent wirings for the local source lines 250 and 250A of the metal layer 1, the line width of the local source lines 250 and 250A can be increased, thereby reducing the entire resistance of the source lines. In particular, since the area of the local source line 250A shown in FIG. 7A is greater than that of the local source line 250 shown in FIG. 3, the resistance of the local source line 250A can be reduced further. In this case, for the electrical connection between the source line SL0 of the metal layer 2 and the local source line 250A of the metal layer 1, a plurality of contact plugs 260 can be formed in the direction of the bit lines, so that the connection resistance between the metal layer 1 and the metal layer 2 is reduced. Thus, the uniformity of the voltages of the source lines in the memory array can be improved, and a memory array structure with high reliability can be obtained.

Figure 8:
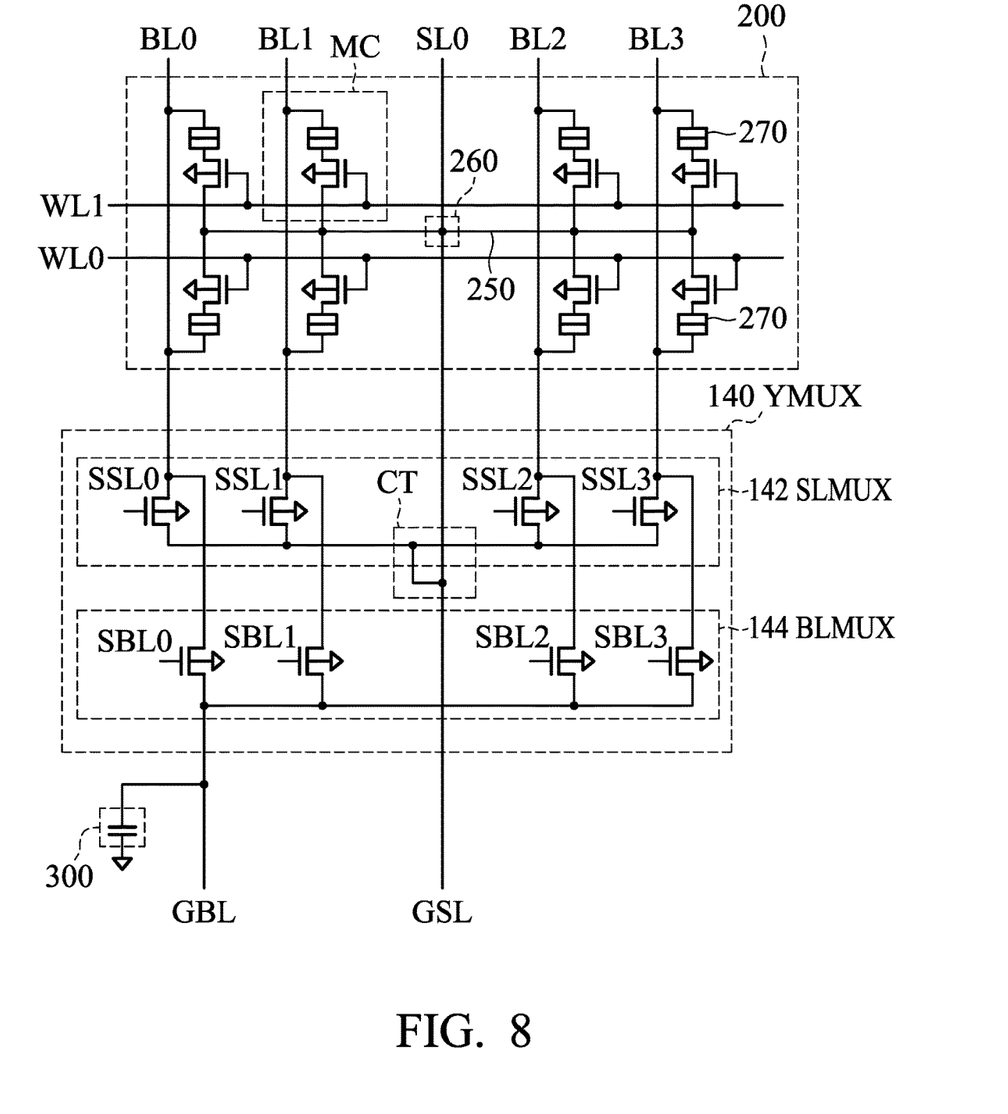
FIG. 8 shows a schematic diagram showing structures of the memory array and a row selection circuit according to another exemplary embodiment.

In the following paragraphs, a second embodiment of the present invention will be described. FIG. 8 is a diagram showing circuit structures of a memory array and a row selection circuit of a resistive memory according to the second embodiment. The second embodiment comprises the structure shown in FIG. 5 and further comprises an AC matching capacitor 300. The capacitance of the AC matching capacitor 300 is connected to each global bit line GBL to make the capacitance of the global bit line GBL to be equal to the capacitance of the global source line GSL equal or reduce the capacitance difference therebetween.

In the write operation, when a write pulse is applied to the global source line GSL, write interference may occur in the memory cells of the unselected bit lines. For example, when the selected memory cell MC shown in FIG. 8 is reset, the write pulse with the amplitude VRST is applied to the global source line GSL. The write pulse is applied to the source region 230 of the access transistor through the local source line 250 and is also applied to the unselected bit lines BL0, BL2, and BL3 through the SLMUX 142 simultaneously. The same write voltage VRST is supplied to the source line SL0 and the unselected bit lines BL0, BL2, and BL3, however, since the source line SL0 is connected to the local source line 250, the load capacitance of the source line SL0 is different from the load capacitance of the bit lines, and potential difference is generated between them. Since the access transistors of the unselected memory cells connected to the selected word line WL1 are turned on, bias voltages are generated in the variable resistive elements 270 of the unselected memory cells in response to the potential difference between the source line and the bit lines when a fast-ramp writing pulse is applied, which results in that the unselected memory cell may be set erroneously. Therefore, in the present embodiment, in order to make the load capacitance of the source line SL0 to be equal to the load capacitance of the bit lines, the capacitor 300 is connected to the global bit line GBL, so that the potential difference between the source line and the bit lines is reduced, and the write interference for the memory cells is suppressed.

The capacitor 300 may be, for example, an MIM (Metal Insulator Metal) structure, a MOS capacitor, or a dummy wiring. For example, the capacitance of the capacitor 300 may be used to compensate for the wiring capacitance of the local source line 250 connected to the source line. The capacitor 300 can be disposed in, for example, the write driver and read bias circuit 170.

In the embodiment, by optimizing the capacitance of the capacitor 300, the voltage difference between the global bit line GBL and the global source line GSL can be reduced, and the write interference is suppressed. It also allows the use of a fast-ramp write pulse, which improves the write speed. Furthermore, a matching capacitor is disposed in the write driver and read bias circuit 170, which can reduce the area of the capacitor.

In the above embodiment, the selection transistors of the SLMUX 142 and the BLMUX 144 are implemented by NMOSs. Thus, the row decoder and driving circuit 130 can provide the selection signals SSL/SBL which are boosted to a voltage higher than Vdd to the gates of the selection transistors. In addition, complementary metal oxide semiconductor (CMOS) transistors can be used in the SLMUX 142 and the BLMUX 144 can use as other types of analog switches.

In the above embodiment, one source line on the memory array is shared by four bit lines, but this is only an example, and the present invention is not limited thereto. In the present invention, one source line is shared by at least 2m bit lines (m is an integer that is greater than or equal to 1). In this case, the m bit lines are arranged on the left side of the source line, and the other m bit lines are arranged on the right side. Symmetry of the bit lines is preferred for considering the resistance of the source lines, but not the symmetry absolutely necessary when the resistance of the source lines is sufficiently small. Also, shared bit lines may be arranged only on the left side or the right side of the source line.

In another embodiment, two source lines may be shared by 4 m bit lines. In this case, m bit lines are arranged on the left side of the first source line, 2m bit lines are arranged between the first source line and the second source line, and m bit lines are arranged on the right side of the second source line. In another embodiment, two source lines may be shared by 3m bit lines. In this case, the m bit lines are arranged on the left side of the first source line, the m bit lines are arranged between the first source line and the second source line, and the m bit lines are arranged on the right side of the second source line. Furthermore, three source lines may be shared by a plurality of bit lines.

In the above embodiment, the lines connected to the variable resistive elements are the bit lines, and the lines connected to the access transistors are the source lines. However, these connection structures are arbitrary, that is, the lines connected to the variable resistive elements are the source lines, and the lines connected to the access transistors are the bit lines. Also, in the above embodiment, the bit lines and the source lines can be exchanged.

Compared with the prior art in which the bit lines and the source lines are arranged in a one-to-one relationship, since one or a plurality of source lines are shared by a plurality of bit lines in the embodiments, the line width of the shared source lines can be reduced. In addition, since thick source lines can be used with the minimum loss of area and cost, the resistance of the source lines becomes smaller. Thus, a uniform voltage pulse can be applied to the memory cells, thereby performing a write operation with high reliability. Furthermore, as the prior art in which each bit line corresponds to one source line, the pulse voltage can be controlled simply in the bit-line direction by the original manner.

In the above embodiment, the source lines connected to the source regions of the access transistors are formed by the metal layer 1 and the metal layer 2, and the bit lines connected to the tops of the electrodes of the variable resistive elements are formed by the metal layer 2, but this is only an example, and the present invention is not limited thereto. For example, the source lines may be formed by a multi-layer wiring structure having more than one layer. By using such structure, the resistance of the source lines can be effectively reduced. Moreover, it is possible to easily control the resistance of the source lines by matching the resistance of the variable resistive elements. Furthermore, since thinner source lines are used due to the multi-layer wiring structure, there is enough space for formation of thicker source lines.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A resistive memory for storing data by reversible and nonvolatile variable resistive elements comprising:
    a memory array comprising a plurality of memory cells arranged in columns and rows, each memory cell comprising one variable resistive element and one access transistor connected to the variable resistive element, wherein gates of the access transistors in each column are connected to a word line, first electrodes of the variable resistive elements in each row are connected to a bit line, and second electrodes of the variable resistive elements in each row are connected to a source line,
    wherein the source line comprises a first source line extending in a direction that is parallel to the bit line and a second source line derived from the first source line, and
    wherein the second source line extends in a direction that is orthogonal to the bit lines and are shared by several memory cells.

2. The resistive memory as claimed in claim 1, wherein the first source is shared by 2m bit lines, and m is an integer that is greater than or equal to 1.

3. The resistive memory as claimed in claim 2, wherein the first source is shared by m bit lines arranged on the left side of the source line and m bit lines on the right side of the source line.

4. The resistive memory as claimed in claim 1, wherein the first source line is formed by the same first wiring layer as the first bit lines, and the second source line is formed by a second wiring layer which is under the first wiring layer.

5. The resistive memory as claimed in claim 1, further comprising:
    a column selection device selecting the word lines in the columns of the memory array according to a column address;
    a row selection device selecting the bit lines and the source lines in the rows of the memory array according to a row address; and
    a voltage providing device providing voltages to the bit lines and the selected source lines which are selected by the row selection device in response to an operation mode,
    wherein a write voltage is applied to the variable resistive elements from the selected bit lines and the selected source lines two bi-directions.

6. The resistive memory as claimed in to claim 5, wherein the row selection device comprises:
    a first switch circuit and a second switch circuit,
    wherein the first switch circuit performs a selective connection between a global source line connected to the source line of the memory array and the 2m bit lines, and m is an integer that is greater than or equal to 1, and wherein the second switch circuit performs a selective connection between a global bit line and the 2m bit lines.

7. The resistive memory as claimed in claim 6,
wherein the first switch circuit connects unselected bit lines among the 2m bit lines to the global source line and disconnects a selected bit line among the 2m bit lines from the global source line, and wherein the second switch circuit connects the selected bit line among the 2m bit lines to the global bit line and disconnects the unselected bit lines among the 2m bit lines from the global bit line.

8. The resistive memory as claimed in claim 6, wherein when the write voltage is provided to the global source line, the unselected bit lines are pre-charged to the write voltage.

9. The resistive memory as claimed in claim 6, wherein the global bit line is coupled to a capacitor to compensate for difference of load capacitance between the global bit line and the source line.

10. The resistive memory as claimed in claim 9, wherein the voltage providing device comprises the capacitor.

\* \* \* \* \*